United States Patent
Takahara et al.

(10) Patent No.: US 8,942,844 B2
(45) Date of Patent: Jan. 27, 2015

(54) ARTICLE STORAGE FACILITY AND ARTICLE STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka (JP)

( * ) Notice: Subject to any disclaimer, the term of this patent is extended or adjusted under 35 U.S.C. 154(b) by 161 days.

(21) Appl. No.: 13/723,300

(22) Filed: Dec. 21, 2012

(65) Prior Publication Data
US 2014/0003893 A1    Jan. 2, 2014

(30) Foreign Application Priority Data

Dec. 26, 2011    (JP) .................................. 2011-284256

(51) Int. Cl.
*G06F 7/00* (2006.01)
*B65G 1/06* (2006.01)
*H01L 21/673* (2006.01)
*H01L 21/677* (2006.01)

(52) U.S. Cl.
CPC ............ *B65G 1/06* (2013.01); *H01L 21/67393* (2013.01); *H01L 21/67769* (2013.01)
USPC .......................................... 700/214; 700/213

(58) Field of Classification Search
USPC ................................................ 700/214, 213
See application file for complete search history.

(56) References Cited

U.S. PATENT DOCUMENTS

2012/0283867 A1* 11/2012 Gelbman et al. ............... 700/215
2013/0158701 A1*  6/2013 Nomura ........................ 700/214

FOREIGN PATENT DOCUMENTS

JP    2009120372 A    6/2009
JP    2010182747 A    8/2010

* cited by examiner

*Primary Examiner* — Ramya Burgess
(74) *Attorney, Agent, or Firm* — The Webb Law Firm

(57) ABSTRACT

An article storage facility includes a transport device for transporting the transporting containers to the plurality of storage units, a controller, and a supply state detecting device for detecting a supply state of the inactive gas to the plurality of storage units. The controller makes a determination based on detected information from the supply state detecting device as to whether the inactive gas is properly supplied, and manages the plurality of storage units by distinguishing the disallowed storage units for which it is determined that the inactive gas is not properly supplied from the allowed storage units that are the storage units that are not the disallowed storage units. The controller performs a retreating transport operation in which a transporting container, that is stored in the storage unit that is changed from the allowed storage unit to the disallowed storage unit, is transported to an allowed storage unit.

14 Claims, 10 Drawing Sheets

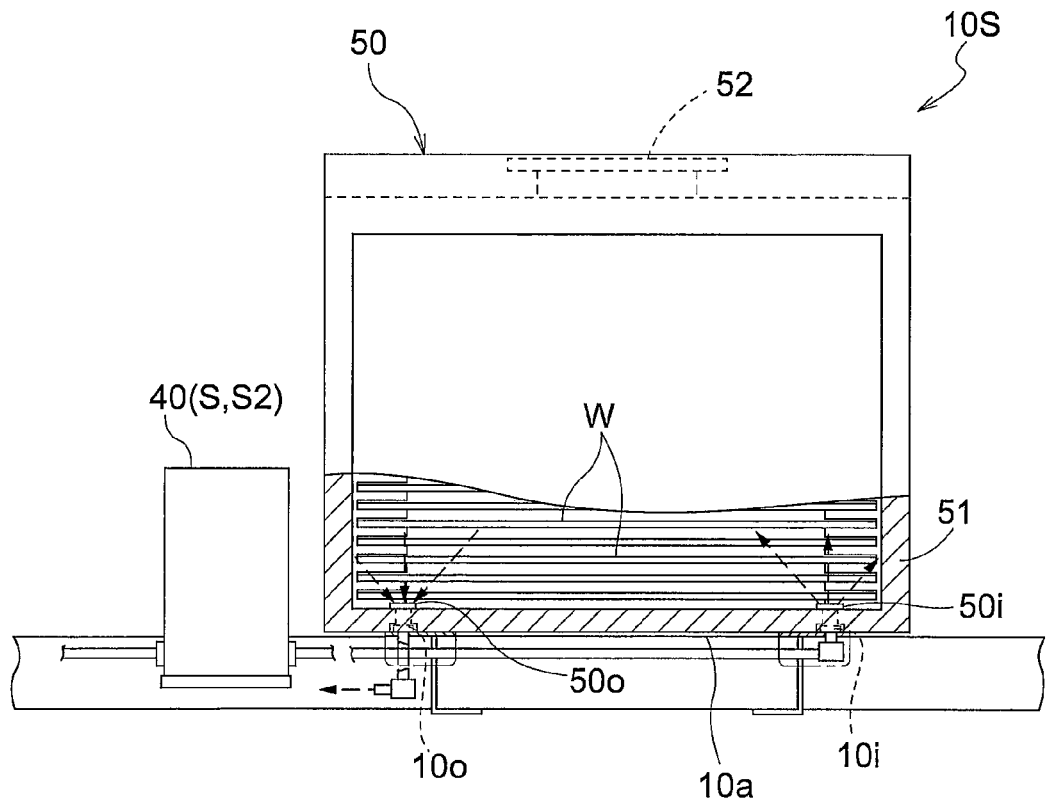
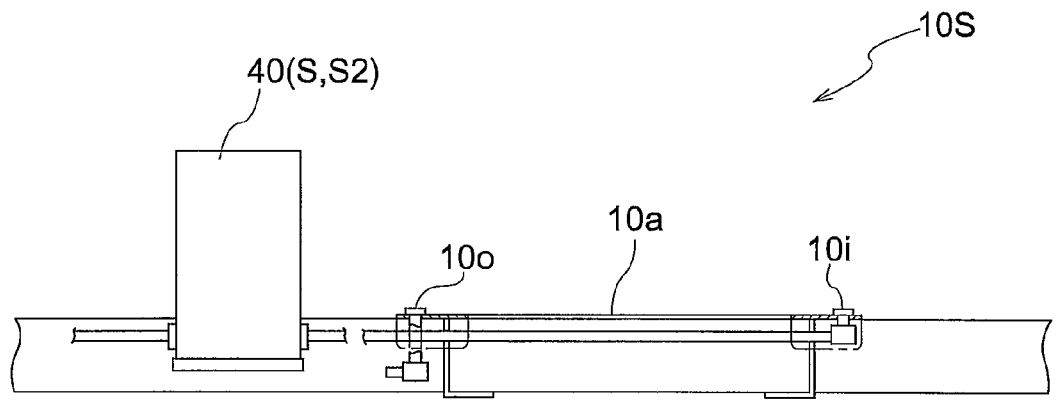

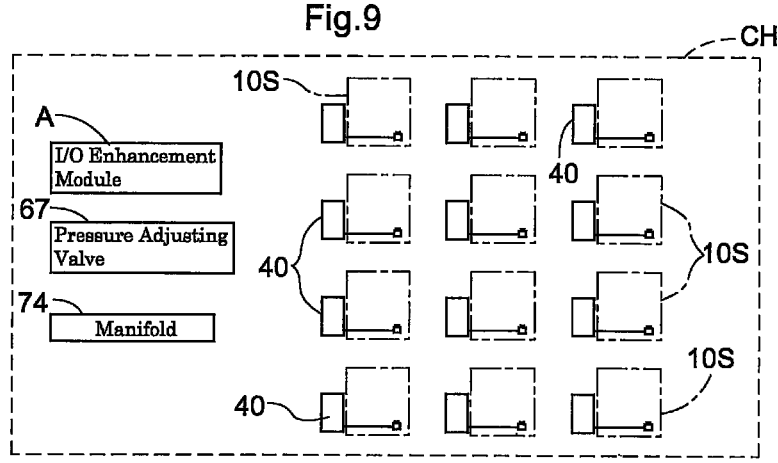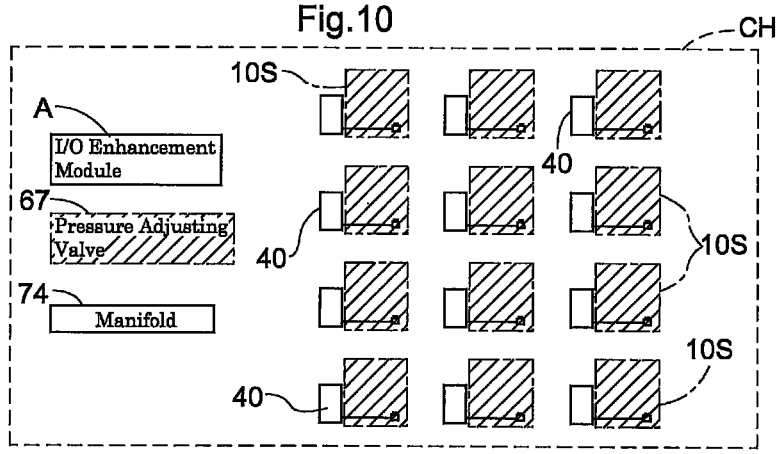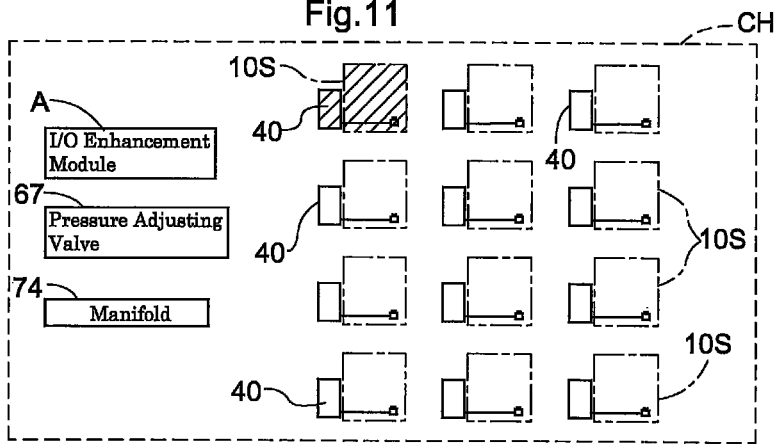

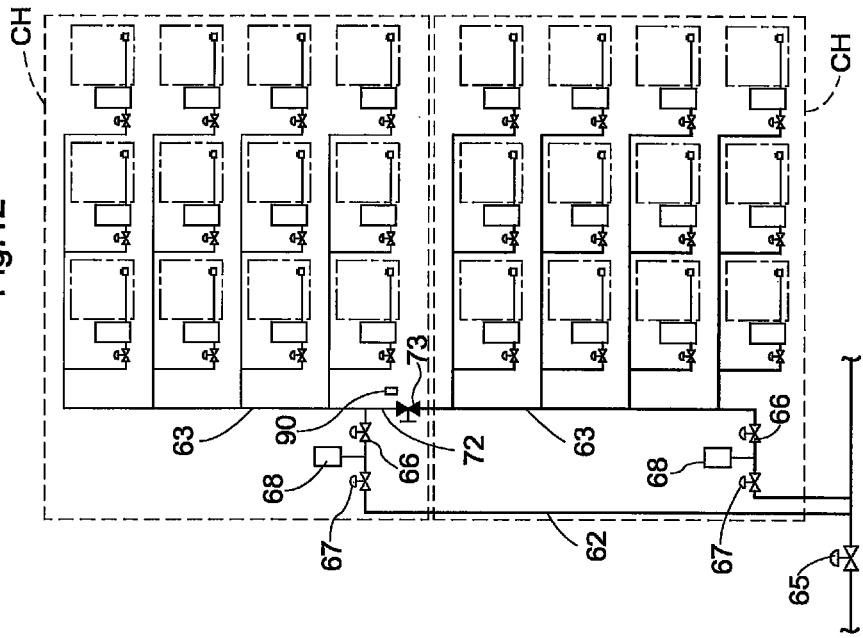
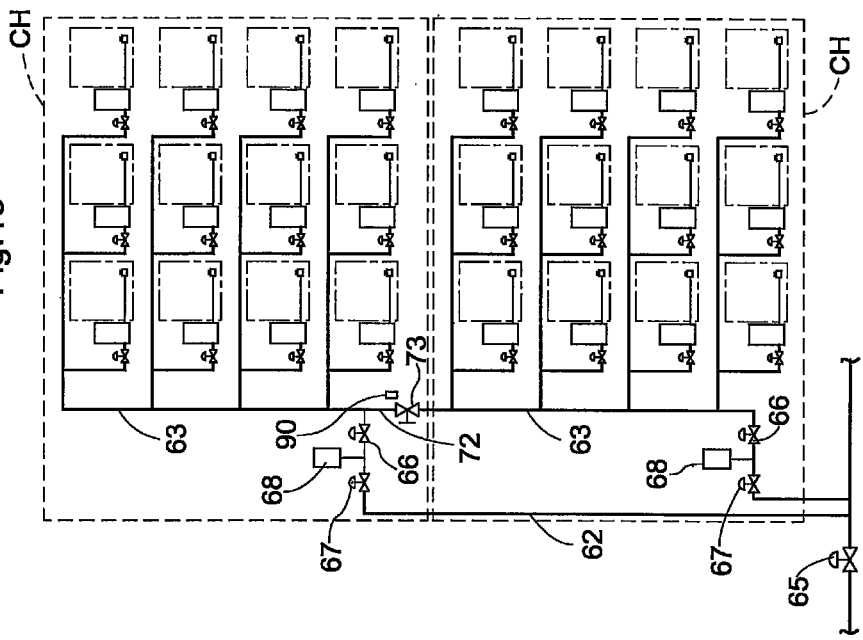

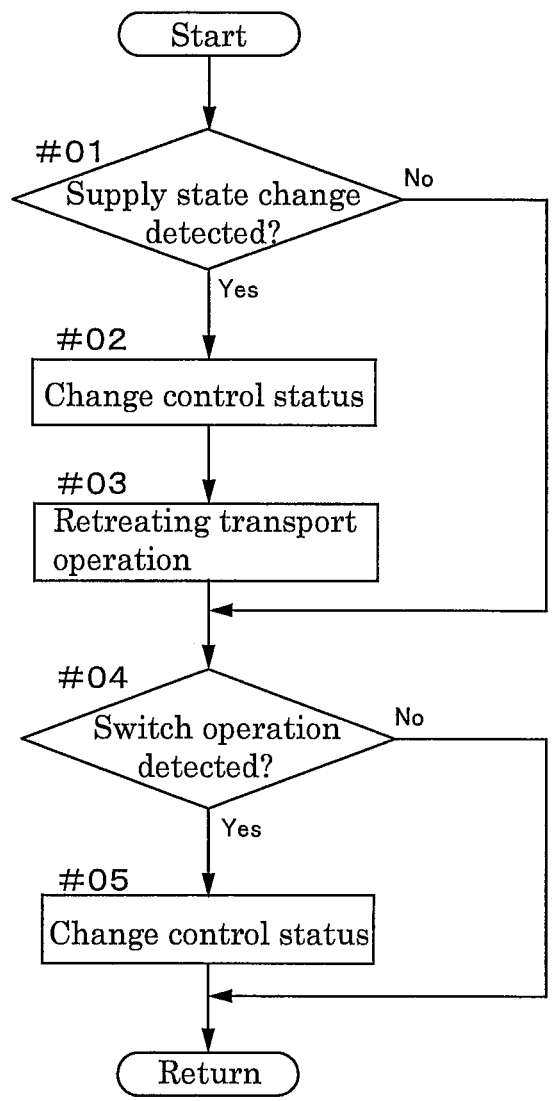

ARTICLE STORAGE FACILITY AND ARTICLE STORAGE METHOD

FIELD OF THE INVENTION

The present invention relates to an article storage facility comprising a plurality of storage units for storing transporting containers for housing substrates, a transport device for transporting the transporting containers to the plurality of storage units, inactive gas feed passages for supplying inactive gas to each of the plurality of said storage units, a discharge portion for discharging the inactive gas supplied to an associated one of the storage units by an associated one of the inactive gas feed passages into the interior of an associated one of the transporting containers stored in the associated one of the storage units, and a controller for controlling an operation of the transport device, as well as to an article storage method using such an article storage facility.

BACKGROUND

An example of article storage facilities such as one described above is disclosed in JP Publication of Application No. 2010-182747 (Patent Document 1). The article storage shelf with a purging function and provided in an article storage facility of Patent Document 1 includes a plurality of storage units for storing transporting containers such as FOUPs, etc. for housing semiconductor wafers. And the facility is configured to supply inactive gas, such as nitrogen gas or gaseous argon, to each of the storage units by means of inactive gas feed passages and to discharge the inactive gas to the interior of each transporting container with a discharge portion.

In the facility disclosed in Patent Document 1, the inactive gas is injected into the interior of the transporting container through the discharge portion when a transporting container is stored in a storage unit to discharge oxygen gas, vapor, etc. that have negative effects on the substrates out of the transporting container and to fill the interior of the transporting container stored in the storage unit with the inactive gas. This reduces the occurrences of negative effects, such as oxidization etc., on the substrates stored in the transporting container.

With the article storage facility of Patent Document 1 described above, however, the transporting container continues to be stored in the same storage unit even if the inactive gas is not properly supplied to the storage unit due to damage to an inactive gas feed passage or failure of, for example, a device such as a pressure adjusting valve provided in an inactive feed passage. Thus, the environment in a transporting container worsens if the inactive gas is not properly supplied to its storage unit, because, for example, the ambient air flows into the transporting container, allowing negative effects on the substrates in the transporting container to occur.

SUMMARY OF THE INVENTION

In light of this background, an article storage facility is desired in which negative effects on substrates in a transporting container stored in a storage unit can be prevented from occurring even when it becomes impossible to properly supply inactive gas to a storage unit.

An article storage facility in accordance with the present invention comprises:

a plurality of storage units for storing transporting containers for housing substrates;

a transport device for transporting the transporting containers to the plurality of storage units;

inactive gas feed passages for supplying inactive gas to each of the plurality of said storage units;

a discharge portion for discharging the inactive gas supplied to an associated one of the storage units by an associated one of the inactive gas feed passages into the interior of an associated one of the transporting containers stored in the associated one of the storage units;

a controller for controlling operation of the transport device;

a supply state detecting device for detecting a supply state of the inactive gas to the plurality of storage units;

wherein the controller is configured to make a supply state determination which is a determination based on detected information from the supply state detecting device as to whether the inactive gas is properly supplied and to manage the plurality of storage units by distinguishing disallowed storage units for which it is determined that the inactive gas is not properly supplied, from allowed storage units that are the plurality of storage units that are not the disallowed storage units, and wherein the controller is further configured to perform a retreating transport operation in which a transporting container, that is stored in one of the storage units that is changed from the allowed storage unit to the disallowed storage unit due to a change in a supply state of the inactive gas, is transported to another one of the storage units that is managed as the allowed storage unit.

With the above-described arrangement, by selecting an allowed storage unit when storing a transporting container in a storage unit, the inactive gas can be properly supplied to the stored transporting container.

In addition, even if the amount of the inactive gas supplied to a storage unit decreases to below a proper supply amount or if the inactive gas is not supplied to the storage unit at all due to damage to a nitrogen gas feed passage or failure of, for example, a device, such as a pressure adjusting valve, provided in an inactive gas feed passage, the storage unit is changed or switched from an allowed storage unit to a disallowed storage unit. And the retreating transport operation is performed to transport the transporting container stored in the storage unit which was changed to the disallowed storage unit to a storage unit managed as an allowed storage unit. Thus, even if it becomes impossible to properly supply the inactive gas to a storage unit, the transporting container stored in the storage unit is transported to an allowed storage unit and thus the inactive gas can be properly supplied in this allowed storage unit. Thus, negative effects on the substrates in the transporting container can be prevented from occurring.

The technical features of the article storage facility in accordance with the present invention can be applied also to an article storage method, which is thus within the scope of the present invention. The functions and effects associated with the article storage facility described above can be also achieved with this article storage method.

Specifically, an article storage method in accordance with the present invention is a method that uses an article storage facility that includes:

a plurality of storage units for storing transporting containers for housing substrates;

a transport device for transporting the transporting containers to the plurality of storage units;

inactive gas feed passages for supplying inactive gas to each of the plurality of said storage units;

a discharge portion for discharging the inactive gas supplied to an associated one of the storage units by an associated one of the inactive gas feed passages into the interior of an associated one of the transporting containers stored in the associated one of the storage units;

a controller for controlling operation of the transport device;

a supply state detecting device for detecting a supply state of the inactive gas to the plurality of storage units;

the method comprising the following steps that are performed by the controller:

a storage unit managing step in which a supply state determination, which is a determination based on detected information from the supply state detecting device as to whether the inactive gas is properly supplied, is performed, and in which the plurality of storage units are managed by distinguishing disallowed storage units for which it is determined that the inactive gas is not properly supplied, from allowed storage units that are the plurality of storage units that are not the disallowed storage units; and a retreating transport operation step in which a transporting container, that is stored in one of the storage units that is changed from the allowed storage unit to the disallowed storage unit due to a change in a supply state of the inactive gas, is transported to another one of the storage units that is managed as the allowed storage unit.

An example of a preferred embodiment of the present invention is described next.

In an embodiment of the article storage facility in accordance with the present invention, the plurality of storage units are preferably divided into a plurality of sections, wherein a section supply state detecting device for detecting the supply state of the inactive gas to an associated one of the plurality of sections is preferably provided as the supply state detecting device, and wherein the controller is preferably configured to perform the supply state determination based on detected information from the section supply state detecting device and to manage all of the storage units, belonging to a section for which it is determined that the inactive gas is not properly supplied, as the disallowed storage units.

For example, it is conceivable to provide a single supply state detecting device that detects the supply state of inactive gas to all of the plurality of storage units as one group. If that is the case, when it is detected that inactive gas is not properly supplied, all of the plurality of storage units would be managed as disallowed storage units. In contrast, with the above-described arrangement, the supply state of the inactive gas to the plurality of storage units in each section is detected by the section supply state detecting device; thus, only the storage units belonging to the section to which the inactive gas is not properly supplied can be managed as the disallowed storage units.

Thus, even when inactive gas is no longer properly supplied, if that affects only some of the sections, then only the storage units, belonging to the section which is affected, can be managed as the disallowed storage units while the storage units belonging to unaffected sections can be managed as the allowed storage units. Therefore, all of the plurality of storage units being managed as disallowed storage units can be prevented.

In an embodiment of the article storage facility in accordance with the present invention, the inactive gas feed passages preferably include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, wherein a pressure adjusting device for adjusting a pressure of the inactive gas in the storage unit feeding portions is preferably provided in each connection between a respective one of the section feeding portions and the plurality of the storage unit feeding portions, wherein a pressure detection device for detecting a pressure of the inactive gas in each of the plurality of the storage unit feeding portions is preferably provided as the section supply state detecting device, and wherein the controller is preferably configured to make a determination as the supply state determination based on detected information from the pressure detection device as to whether an abnormal pressure, with respect to a pressure that has been adjusted by the pressure adjusting device, is detected by the pressure detecting device, and is preferably configured to manage all of the storage units, belonging to the section associated with the section feeding portion in which the abnormal pressure is detected, as the disallowed storage units.

With the above-described arrangement, when failure occurs in the pressure adjusting device and an abnormal pressure with respect to the pressure that has been adjusted by the pressure adjusting device is detected by the pressure detection device, then it is determined that the inactive gas is not properly supplied to the storage units to which the inactive gas is supplied through the pressure adjusting device, and all of the storage units, belonging to the section associated with the section feeding portion in which the abnormal pressure is detected, are managed as the disallowed storage units. And the retreating transport operation is performed to transport the transporting containers stored in the storage units which are switched or changed to the disallowed storage units to other storage units that are managed as allowed storage units. Thus, negative effects on the substrates in the transporting containers stored in the storage units can be prevented from occurring.

In an embodiment of the article storage facility in accordance with the present invention, the inactive gas feed passages preferably include storage unit feeding portions which divert and supply the inactive gas to each of the plurality of storage units, wherein the article storage facility preferably includes a flow rate adjusting device for adjusting a flow rate of the inactive gas supplied to respective discharge portion with the flow rate adjusting device being provided in each connection between an associated one of the storage unit feeding portions and the respective discharge portion, and a relaying device for relaying communication between the controller and the plurality of flow rate adjusting devices belonging to respective section, wherein a relay failure detection device for detecting an abnormal condition of the relaying device is preferably provided as the section supply state detecting device, and wherein the controller is preferably configured: to control operation of the flow rate adjusting device through the relaying device; to make a determination as the supply state determination as to whether an abnormal condition is detected by the relay failure detection device based on detected information from the relay failure detection device; and to manage all of the storage units, belonging to the section associated with the relaying device in which the abnormal condition is detected, as the disallowed storage units.

With the above-described arrangement, if and when it is detected by the relay failure detection device that an abnormal condition has occurred in the relaying device, then it is determined that the inactive gas is not properly supplied to the storage units to which the inactive gas is supplied through the flow rate adjusting device with which the relaying device communicates and all of the storage units, belonging to the section associated with the relaying device in which the abnormal condition is detected, are managed as the disallowed storage units. And the retreating transport operation is performed to transport the transporting containers stored in the storage units which are switched or changed to the disallowed storage units to other storage units that are managed as allowed storage units. Thus, negative effects on the substrates in the transporting containers stored in the storage units can be prevented from occurring.

In an embodiment of the article storage facility in accordance with the present invention, a storage unit supply state detecting device for detecting a supply state of the inactive gas to each of the plurality of storage units is preferably provided as the supply state detecting device, and wherein the controller is preferably configured to perform the supply state determination based on detected information from the storage unit supply state detecting device and to manage the storage unit, for which it is determined that inactive gas is not properly supplied, as the disallowed storage unit.

With the above-described arrangement, the supply state of the inactive gas to each of the plurality of storage units is detected by the storage unit supply state detecting device; thus, only the storage unit to which the inactive gas is not properly supplied can be managed as a disallowed storage unit.

Thus, even when the inactive gas is no longer properly supplied, if that affects only some of the storage units, then only the storage units that are affected can be managed as disallowed storage units while unaffected storage units can be managed as allowed storage units. Therefore, more storage units than necessary being managed as disallowed storage units can be prevented.

In an embodiment of the article storage facility in accordance with the present invention, the plurality of storage units are preferably divided into a plurality of sections, wherein a section supply state detecting device for detecting the supply state of the inactive gas to an associated one of the plurality of sections is preferably provided as the supply state detecting device in addition to the storage unit supply state detecting device, wherein the controller is preferably configured to perform the supply state determination based on detected information from the section supply state detecting device and to manage all of the storage units, belonging to a section for which it is determined that the inactive gas is not properly supplied, as the disallowed storage units, and wherein, as the retreating transport operation, the controller is preferably configured to preferentially transport, to the allowed storage unit, the transporting container stored in the storage unit for which it is determined based on detected information from the storage unit supply state detecting device that the inactive gas is not properly supplied.

When all of the storage units, belonging to the section for which it is determined based on the detected information from the section supply state detecting device that the inactive gas is not properly supplied, are managed as disallowed storage units, the retreating transport operation is performed to transport the transporting containers, stored in all of the storage units belonging to the section in question, to other storage units that are managed as allowed storage units. In this case, with the above-described arrangement, the transporting containers stored in storage units for which it is determined based on the detected information from the storage unit supply state detecting device that the inactive gas is not properly supplied, are transported to the allowed storage units more preferentially than those in other storage units. Thus, the transporting containers stored in the storages units with higher probability that the inactive gas is no longer properly supplied can be quickly transported to the allowed storage units. As a result, negative effects on the substrates can be prevented from occurring.

In an embodiment of the article storage facility in accordance with the present invention, the inactive gas feed passages preferably include storage unit feeding portions which supply the inactive gas to each of the plurality of storage units, wherein a feed rate adjusting device for adjusting a flow rate of the inactive gas supplied to respective discharge portion is preferably provided in each connection between an associated one of the storage unit feeding portions and the respective discharge portion, wherein an abnormal flow condition detecting device for detecting an abnormal condition of the feed rate adjusting device is preferably provided as the storage unit supply state detecting device, and wherein the controller is preferably configured to make a determination as the supply state determination based on detected information from the abnormal flow condition detecting device as to whether an abnormal condition is detected by the abnormal flow condition detecting device, and to manage the storage unit, to which the inactive gas is supplied through the feed rate adjusting device in which the abnormal condition was detected, as the disallowed storage unit.

With the above-described arrangement, when an abnormal condition occurs in the feed rate adjusting device, and the abnormal condition is detected by the abnormal flow condition detecting device, it is determined that the inactive gas is not properly supplied to the storage unit to which the inactive gas is supplied through the feed rate adjusting device in question and the storage unit, associated with the feed rate adjusting device in which the abnormal condition is detected, is managed as a disallowed storage unit. And the retreating transport operation is performed to transport the transporting container, stored in the storage unit which is changed to the disallowed storage unit, to another storage unit that is managed as an allowed storage unit. Thus, negative effects on the substrates in the transporting containers stored in the storage units can be prevented from occurring.

In an embodiment of the article storage method in accordance with the present invention, the plurality of storage units are preferably divided into a plurality of sections, wherein a section supply state detecting device for detecting the supply state of the inactive gas to an associated one of the plurality of sections is preferably provided as the supply state detecting device, and wherein, in the storage unit managing step, the supply state determination is preferably performed based on detected information from the section supply state detecting device, and all of the storage units, belonging to a section for which it is determined that the inactive gas is not properly supplied, are preferably managed as the disallowed storage units.

In an embodiment of the article storage method in accordance with the present invention, the inactive gas feed passages preferably include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, wherein the article storage facility preferably includes a pressure adjusting device for adjusting a pressure of the inactive gas in the storage unit feeding portions, the pressure adjusting device being provided in each connection between a respective one of the section feeding portions and the plurality of the storage unit feeding portions, wherein a pressure detection device for detecting a pressure of the inactive gas in each of the plurality of the storage unit feeding portions is preferably provided as the section supply state detecting device, and wherein, in the storage unit managing step, a determination is preferably made as the supply state determination based on detected information from the pressure detection device as to whether an abnormal pressure, with respect to a pressure that has been adjusted by the pressure adjusting device, is detected by the pressure detecting device, and all of the storage units, belonging to the section associated with the section feeding portion in which the abnormal pressure is detected, are preferably managed as the disallowed storage units.

In an embodiment of the article storage method in accordance with the present invention, the inactive gas feed passages preferably include storage unit feeding portions which divert and supply the inactive gas to each of the plurality of storage units, wherein the article storage facility preferably includes a flow rate adjusting device for adjusting a flow rate of the inactive gas supplied to respective discharge portion with the flow rate adjusting device being provided in each connection between an associated one of the storage unit feeding portions and the respective discharge portion, and a relaying device for relaying communication between the controller and the plurality of flow rate adjusting devices belonging to respective section, wherein a relay failure detection device for detecting an abnormal condition of the relaying device is preferably provided as the section supply state detecting device, wherein the steps performed by the controller preferably further comprises a flow rate adjusting step in which an operation of the flow rate adjusting device is controlled through the relaying device, wherein, in the storage unit managing step, a determination is preferably made as the supply state determination as to whether an abnormal condition is detected by the relay failure detection device based on detected information from the relay failure detection device, and all of the storage units, belonging to the section associated with the relaying device in which the abnormal condition is detected, are preferably managed as the disallowed storage units.

In an embodiment of the article storage method in accordance with the present invention, a storage unit supply state detecting device for detecting a supply state of the inactive gas to each of the plurality of storage units is preferably provided as the supply state detecting device wherein, in the storage unit managing step, the supply state determination is preferably performed based on detected information from the storage unit supply state detecting device, and the storage unit, for which it is determined that inactive gas is not properly supplied, is preferably managed as the disallowed storage unit.

In an embodiment of the article storage method in accordance with the present invention, the plurality of storage units are preferably divided into a plurality of sections wherein a section supply state detecting device for detecting the supply state of the inactive gas to an associated one of the plurality of sections is preferably provided as the supply state detecting device in addition to the storage unit supply state detecting device, wherein, in the storage unit managing step, the supply state determination is preferably performed based on detected information from the section supply state detecting device, and all of the storage units, belonging to a section for which it is determined that the inactive gas is not properly supplied, are preferably managed as the disallowed storage units. wherein, in the retreating transport operation step, the transporting container, that is stored in the storage unit for which it is determined based on detected information from the storage unit supply state detecting device that the inactive gas is not properly supplied, is preferably preferentially transported to the allowed storage unit.

In an embodiment of the article storage method in accordance with the present invention, the inactive gas feed passages preferably include storage unit feeding portions which supply the inactive gas to each of the plurality of storage units, wherein the article storage facility preferably includes a feed rate adjusting device for adjusting a flow rate of the inactive gas supplied to respective discharge portion, the feed rate adjusting device being provided in each connection between an associated one of the storage unit feeding portions and the respective discharge portion, wherein an abnormal flow condition detecting device for detecting an abnormal condition of the feed rate adjusting device is preferably provided as the storage unit supply state detecting device, wherein, in the storage unit managing step, a determination is preferably made as the supply state determination based on detected information from the abnormal flow condition detecting device as to whether an abnormal condition is detected by the abnormal flow condition detecting device, and the storage unit, to which the inactive gas is supplied through the feed rate adjusting device in which the abnormal condition was detected, is preferably managed as the disallowed storage unit.

BRIEF DESCRIPTION OF THE DRAWINGS

FIG. 4 is a front view of the storage unit with a container placed thereon, FIG. 5 is a front view of the storage unit without a container placed thereon, FIG. 9 shows an example of a control status of the storage units by a controller, FIG. 10 shows another example of a control status of the storage units by the controller, FIG. 11 shows yet another example of a control status of the storage units by the controller, FIG. 12 shows how the inactive gas is supplied when a bypass switching valve is closed, FIG. 13 shows how the inactive gas is supplied when the bypass switching valve is open, and FIG. 14 is a flow chart.

DETAILED DESCRIPTION

Embodiments in which the present invention is applied to an article storage facility having a purge function are described next with reference to the accompanying drawings.
(General Construction)

Figure 1:
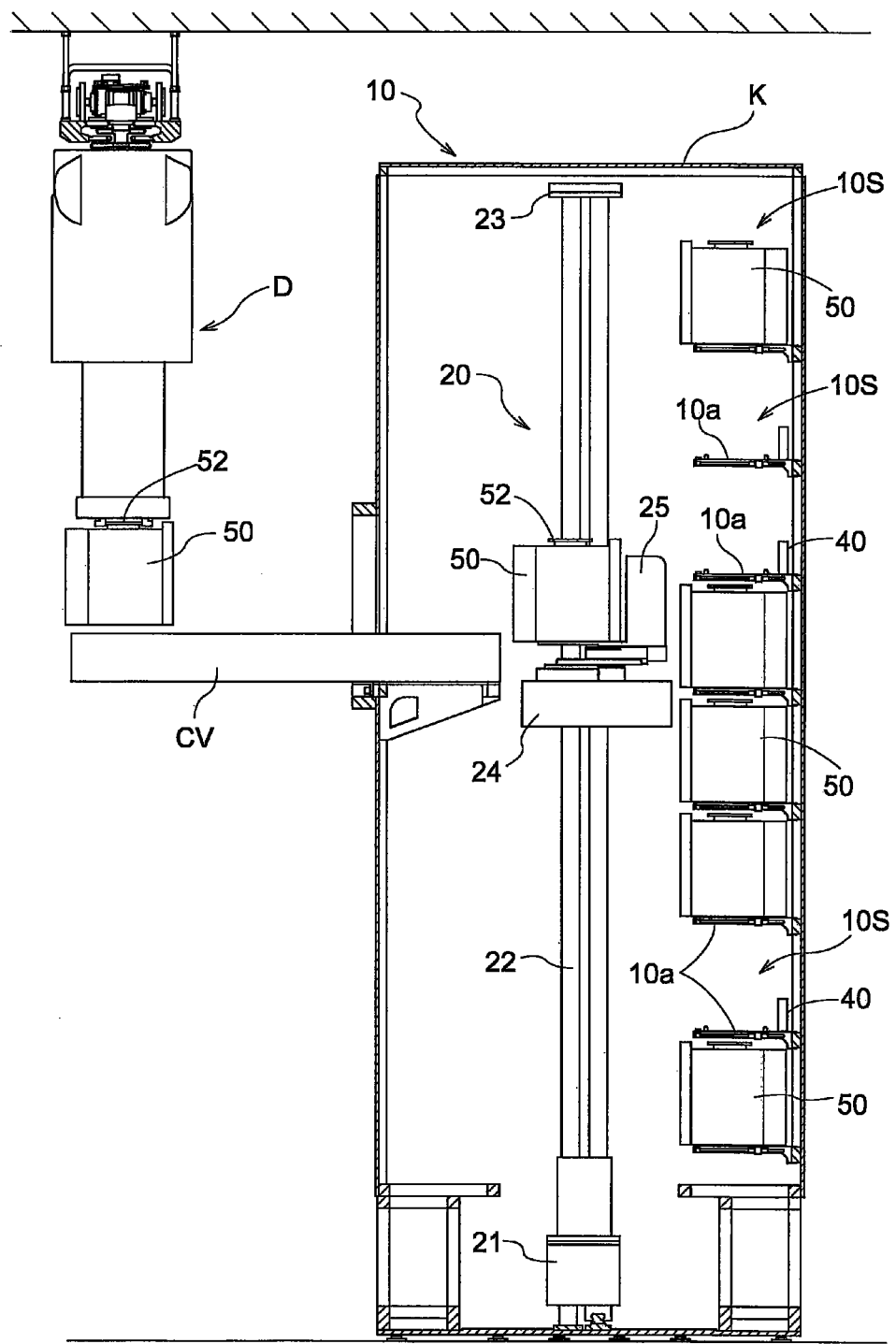
FIG. 1 is a vertical sectional side view of an article storage facility.
Figure 2:
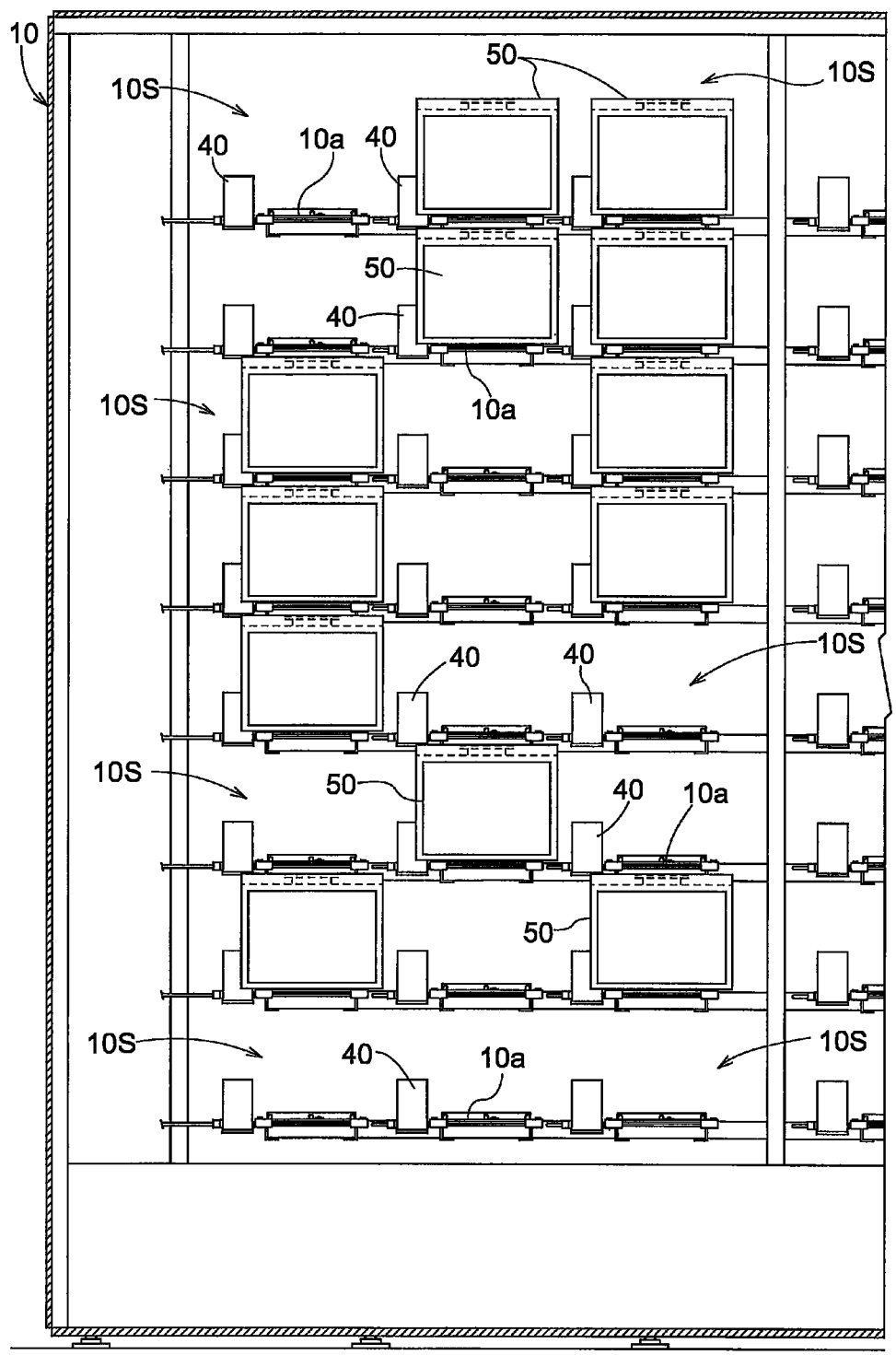
FIG. 2 is a vertical sectional front view showing a part of the facility in FIG. 1.

An article storage facility, as shown in FIG. 1 and FIG. 2, includes a storage shelf 10 having storage units 10S for storing transporting containers 50 (i.e. containers 50 to be transported which are referred to, hereinafter, as containers 50 for short) each accommodating or housing substrates W therein in a sealed state, with the storage units 10S arranged in vertical columns and lateral rows, and a stacker crane 20 as a transport device for transporting the containers 50 to and from the plurality of storage units 10S and to and from the carry in and out conveyor CV. In the present embodiment, a substrate W is a semiconductor wafer, and each container 50 to be stored is a FOUP (Front Opening Unified Pod) which accommodates or houses the semiconductor wafers.
(Construction of Container 50)

As shown in FIG. 4, each container 50 includes a casing 51 having an opening for taking the substrates W in and out of the container 50, and a detachable lid (not shown) for closing the opening of the casing 51.

As shown in FIGS. 1, 2, and 4, a top flange 52, which can be gripped by a hoist type transport carriage D, is formed in the upper face of the container 50. A gas feed opening 50i for introducing nitrogen gas as an inactive gas and a gas discharge opening 50o are provided in the bottom of the container 50. Though not shown, an introducing side opening and closing valve is provided at the gas feed opening 50i whereas a discharging side opening and closing valve is provided at the gas discharge opening 50o.

In other words, the container 50 accommodates the substrates W in a sealed state by virtue of the fact that the opening is closed by the lid, and each of the opening and closing valve at the gas feed opening 50i and the one at the gas discharge opening 50o is closed while the substrates W are accommodated or housed within the container 50.

The introducing side opening and closing valve is urged in its closing direction, or toward its closed position, by means of an urging member such as a spring. And when the discharge pressure of nitrogen gas fed to the gas feed opening 50i becomes higher than a set valve opening pressure which is higher than the atmospheric pressure by a set value, the introducing side opening and closing valve is opened by this pressure.

Further, the discharging side opening and closing valve is urged by the urging member such as a spring in the closing direction or toward its closed position, so that when the pressure inside the container 50 reaches a pressure higher than a set valve opening pressure which is higher than the atmospheric pressure by a set value, the valve is opened by this pressure.

(Construction of Stacker Crane 20)

As shown in FIG. 1, the stacker crane 20 includes a traveling carriage 21 which can run or travel along a travel rail installed on the floor on the side of the front face of the storage shelf 10, a mast 22 mounted erect on the traveling carriage 21, upper frame 23 which is provided in an upper end of the mast 22 and which engages an upper guide rail (not shown), and a lift deck 24 which can be moved up and down, or raised or lowered, as being guided by the mast 22.

A transfer device 25 for transferring the container 50 to or from the storage unit 10S is mounted on the lift deck 24.

The stacker crane 20 is configured to perform a carry-in operation for transporting a container 50 on the carry in and out conveyer CV to the storage unit 10S, a carry-out operation for transporting the container 50 stored in the storage unit 10S to the carry in and out conveyer CV, and a relocating operation for transporting a container 50 in the storage unit 10S to another storage unit 10S, by performing the traveling operation of the traveling carriage 21, the raising and lowering operation of the lift deck 24 and the transfer operation of the transfer device 25.

(Construction of Storage Section 10S)

Figure 6:
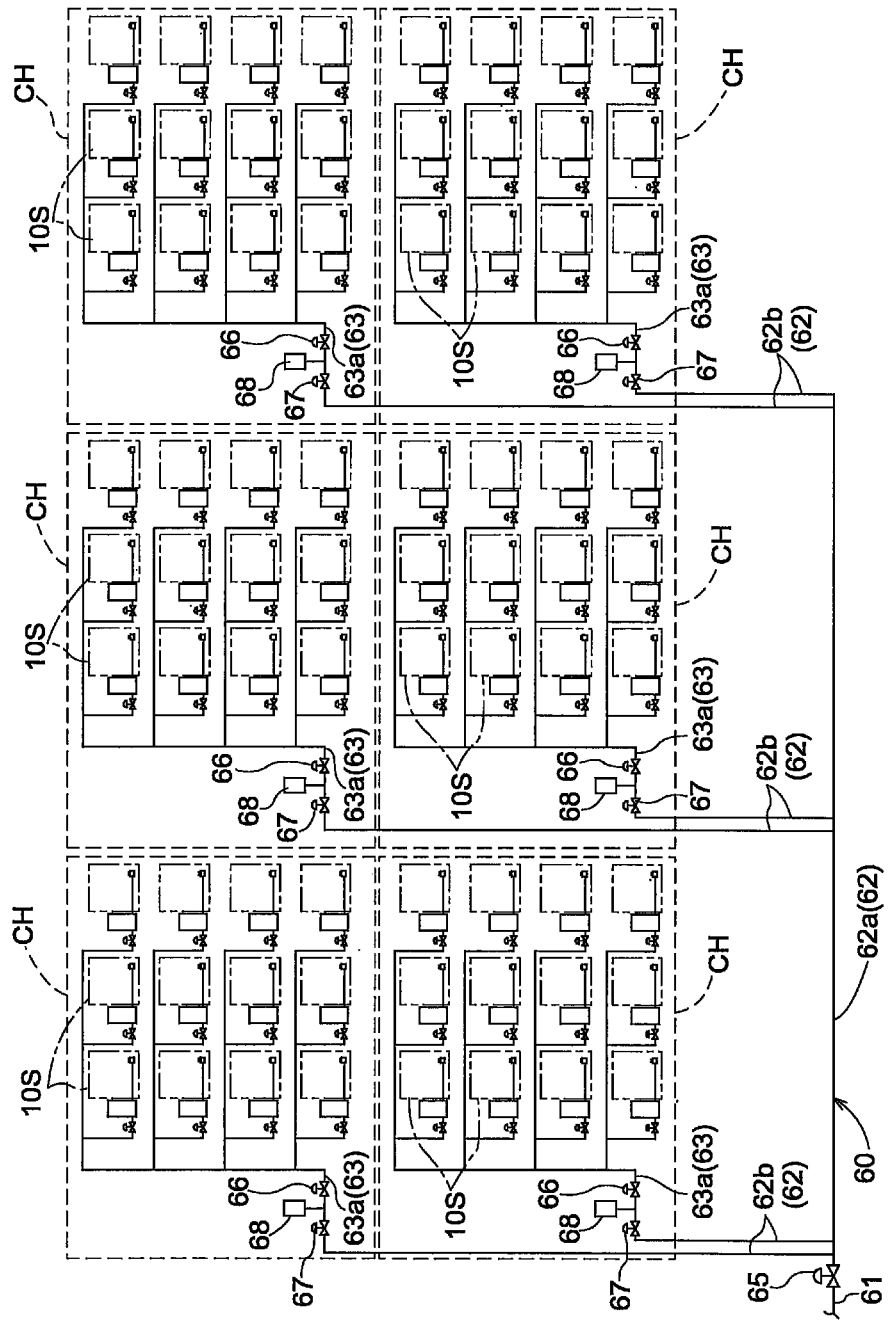
FIG. 6 shows how inactive gas is supplied to different sections.

As shown in FIG. 2, in the storage shelf 10, multiple horizontal rows (eight layers in the present example) of storage units 10S are arranged or layered in the vertical direction whereas multiple vertical columns (nine columns in the present example although FIG. 2 shows only four columns) of storage units 10S are arranged or layered in the lateral direction; thus, there are storage units 10S located at 72 locations in the entire storage shelf 10. And as shown in FIG. 6, the 72 storage units 10S is divided into six sections CH such that each of the 72 storage units 10S belongs to one of the six sections CH, with each section CH consisting of the total of 12 storage units 10S defined by four horizontal rows of storage units 10S arranged or layered in the vertical direction and three vertical columns of the storage units 10S arranged or layered in the lateral direction. Thus, the plurality of storage units 10S in the storage shelf 10 are divided into a plurality of sections CH.

Figure 3:
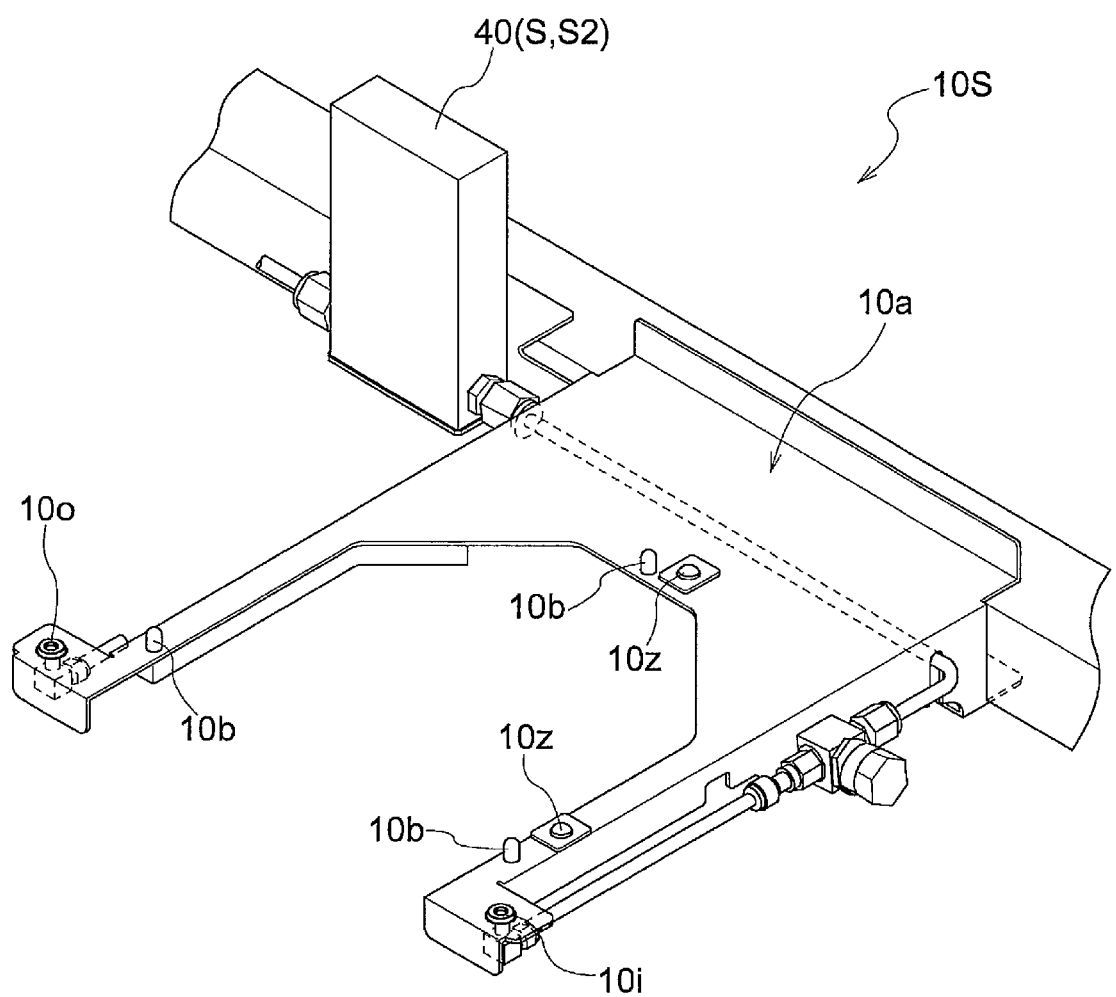
FIG. 3 is a perspective view of a storage unit.

As shown in FIG. 3, each of the plurality of storage units 10S includes a receiving support portion 10a for receiving and supporting the container 50 thereon. And each storage unit 10S stores a container 50 with the container 50 received and supported by the receiving support portion 10a.

In addition, the receiving support portion 10a includes three positioning projections 10b which engage engaged portions (not shown) formed in the undersurface of the container 50 for positioning the container 50 at a predetermined position and a pair of container sensors 10z for detecting whether the container 50 is placed on the receiving support portion 10a (that is, whether a container 50 is stored in the storage unit 10S).

In addition, as shown in FIGS. 3 and 5, the receiving support portion 10a further includes a discharge nozzle 10i for feeding nitrogen gas as an inactive gas into the container 50 stored in a storage unit 10S and a discharging gas passage body 10o which allows a gas discharged from inside the container 50 to pass.

As shown in FIG. 4, the discharge nozzle 10i is so located that the discharge nozzle 10i fits into a gas feed opening 50i provided in the undersurface of the container 50 when the container 50 is placed at the predetermined position on the receiving support portion 10a. In addition, the discharging gas passage body 10o is so located that the discharging gas passage body 10o fits into a gas discharge opening 50o provided in the undersurface of the container 50 when the container 50 is placed at the predetermined position on the receiving support portion 10a.

Thus, when the container 50 is stored in the storage unit 10S and received and supported on the receiving support portion 10a, the container 50 is positioned in a proper position by the positioning projections 10b so that the discharge nozzle 10i is fit into and connected to the gas feed opening 50i of the container 50 while the discharging gas passage body 10o is fit into and connected to the gas discharge opening 50o.

And with the container 50 received and supported on the receiving support portion 10a, the nitrogen gas is introduced to inside the container 50 through the gas feed opening 50i of the container 50 by discharging the nitrogen gas from the discharge nozzle 10i at a pressure higher than the atmospheric pressure by a set value to discharge or remove the gas that is present within the container 50 to the outside through the gas discharge opening 50o.

(Construction for Supplying Nitrogen Gas)

Figure 7:
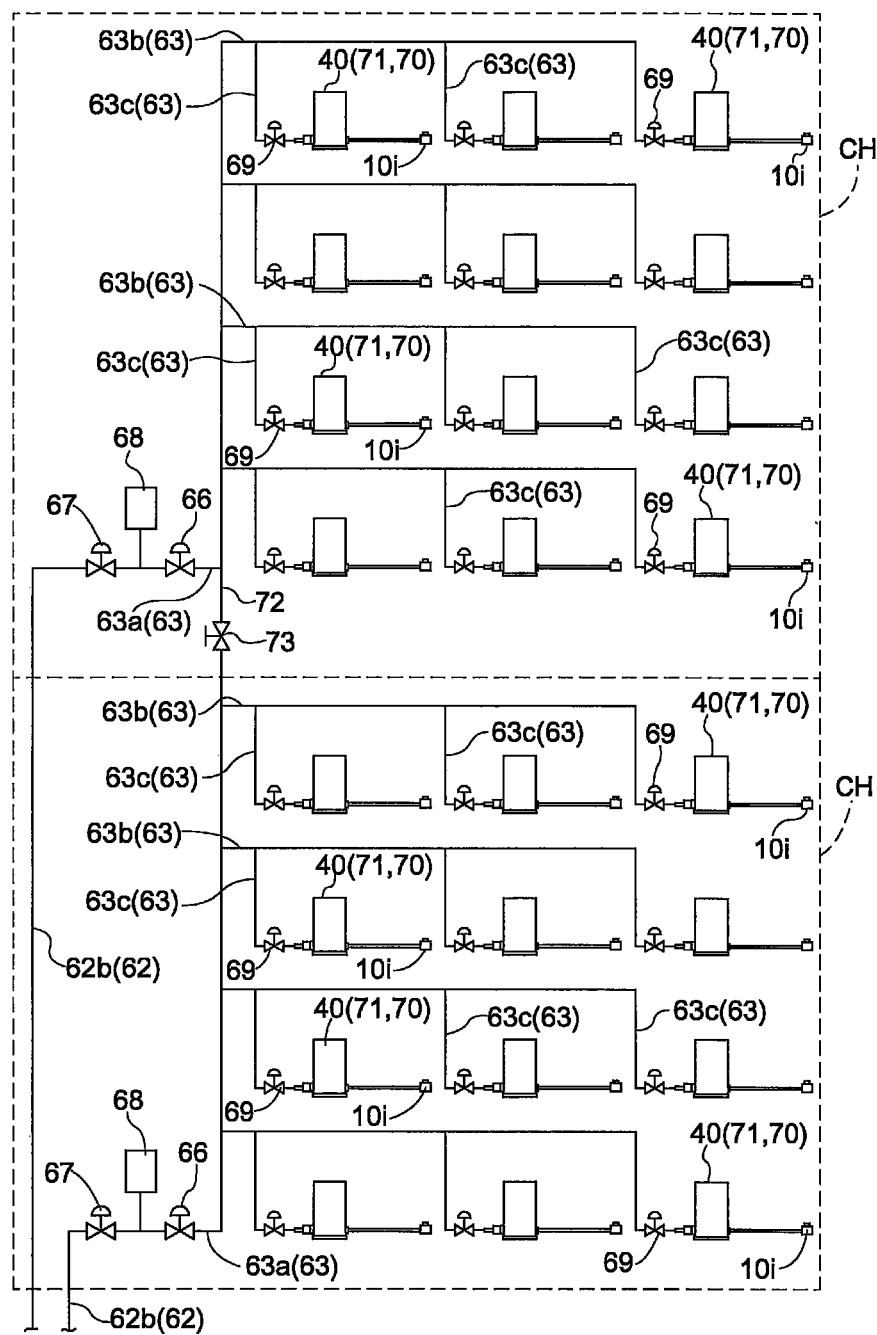
FIG. 7 shows how the inactive gas is supplied to different storage units.

As shown in FIGS. 6 and 7, the article storage facility is provided with nitrogen gas feed passages 60 as inactive gas feed passages for supplying nitrogen gas to the plurality of storage units 10S. This nitrogen gas feed passages 60 are described next. FIG. 6 shows the structure for supplying nitrogen gas to each section CH whereas FIG. 7 shows the structure for supplying nitrogen gas to each storage unit 10S. Note that only two sections CH that are adjacent each other in the vertical direction are shown in FIG. 7.

As shown in FIGS. 6 and 7, the nitrogen gas feed passages 60 include a main feed portion 61, section feeding portions 62 each of which diverts the nitrogen gas supplied by the main feed portion 61 and supplies it to each of the plurality of sections CH, storage unit feeding portions 63 each of which diverts the nitrogen gas supplied to the respective section CH by the section feeding portion 62 and supplies it to each of the plurality of storage units 10S in the section CH.

As shown in FIG. 6, the section feeding portion 62 includes an upstream section feeding portion 62a connected to the main feed portion 61, and a plurality of downstream section feeding portions 62b which branch or break off from the upstream section feeding portion 62a. Six (which is the number of the sections CH) of downstream section feeding portions 62b are connected to the upstream section feeding portion 62a.

Note that the same size pipe (i.e. same diameter pipe) as the main feed portion 61 is used for the upstream section feeding portion 62a whereas smaller size pipes (i.e. pipes with a smaller diameter) than the upstream section feeding portion 62a are used for the downstream section feeding portions 62b.

Six of the storage unit feeding portions 63 are provided to match the number of the sections CH. As shown in FIG. 7, each of the storage unit feeding portions 63 includes an upstream storage unit feeding portion 63a which is connected to the section feeding portion 62, midstream storage unit feeding portions 63b which branch or break off from the upstream storage unit feeding portion 63a, and downstream storage unit feeding portions 63c which branch or break off from each midstream storage unit feeding portion 63b. Four (which is the same as the number of rows of the storage units 10S in the section CH) of the midstream storage unit feeding portions 63b are connected to each upstream storage unit feeding portion 63a whereas three (which is the same as the number of columns of the storage units 10S in the section CH) of the downstream storage unit feeding portions 63c are connected to each midstream storage unit feeding portion 63b.

Note that the same size pipes as (i.e. pipes with the same diameter as) the downstream section feeding portion 62b are used for the upstream storage unit feeding portion 63a and for the midstream storage unit feeding portions 63b whereas smaller size pipes (i.e. pipes with smaller diameter) are used for the downstream storage unit feeding portions 63c than the upstream storage unit feeding portion 63a and the midstream storage unit feeding portions 63b.

As shown in FIG. 6, a main valve 65, which can be switched between an open state in which nitrogen gas can communicate, or flow, from the main feed portion 61 to the section feeding portion 62 and a closed state in which the nitrogen gas cannot communicate from the main feed portion 61 to the section feeding portion 62, is provided at the connection between the main feed portion 61 and the section feeding portion 62. The state of gas supply for each storage shelf 10 can be switched by operating this main valve 65 between a state in which nitrogen gas is supplied to the storage shelf 10 and a state in which nitrogen gas is not supplied to the storage shelf 10.

As shown in FIGS. 6 and 7, provided at each of the connections between the section feeding portion 62 and the plurality of storage unit feeding portions 63 are a section valve 66 which is a valve associated with the section and which can be switched between an open state in which nitrogen gas can communicate from the section feeding portion 62 to the storage unit feeding portion 63 and a closed state in which nitrogen gas cannot communicate from the section feeding portion 62 to the storage unit feeding portion 63, a pressure adjusting valve 67 which functions as a pressure adjusting device for adjusting the pressure of the nitrogen gas in the storage unit feeding portion 63 by adjusting the flow rate of the nitrogen gas communicated from the section feeding portion 62 to the storage unit feeding portion 63, a pressure sensor 68 which functions as a pressure detection device for detecting the pressure of the nitrogen gas in the storage unit feeding portion 63. The state of gas supply for each section CH can be switched by operating this section valve 66 between a state in which nitrogen gas is supplied to the section CH and a state in which nitrogen gas is not supplied to the section CH.

As shown in FIG. 7, provided at each of the connections between the storage unit feeding portion 63 and the discharge nozzles 10i are a mass flow controller 40 and a storage unit valve 69 which is a valve for storage unit and which can be switched between an open state in which the nitrogen gas can communicate from the storage unit feeding portion 63 to the discharge nozzle 10i and a closed state in which the nitrogen gas cannot communicate from the storage unit feeding portion 63 to the discharge nozzle 10i. The state of gas supply for each storage unit 10S can be switched by operating the storage unit valve 69 between a state in which nitrogen gas is supplied to the storage unit 10S and a state in which nitrogen gas is not supplied to the storage unit 10S. As shown only with reference numerals in FIG. 7, each mass flow controller 40 includes a flow rate adjusting valve 70 for adjusting the flow rate of the nitrogen gas supplied from the storage unit feeding portion 63 to the discharge nozzle 10i, and a flow rate sensor 71 for detecting the flow rate of the nitrogen gas communicated from the storage unit feeding portion 63 to the discharge nozzle 10i. In other words, each mass flow controller 40 (flow rate adjusting valve 70) functions as a feed rate adjusting device for adjusting the flow rate of the nitrogen gas supplied to the discharge nozzle 10i.

As shown in FIG. 7, the plurality of storage unit feeding portions 63 are divided into groups of two storage unit feeding portions 63 in the present embodiment. And a bypass portion 72 is provided to allow communication between the two storage unit feeding portions 63 in the same group. Incidentally, the bypass portions 72 are not shown in FIG. 6.

In the present embodiment, each bypass portion 72 is positioned to allow communication between two storage unit feeding portions 63 that belong to two sections CH that are adjacent each other in the vertical direction, with the total of three bypass portions 72 provided in the six sections CH.

In addition, provided in each bypass portion 72 is a bypass switching valve 73 which is a valve for the bypass and which can be switched between an open state in which the nitrogen gas can flow in the bypass portion 72 and a closed state in which the nitrogen gas cannot flow in the bypass portion 72. The bypass switching valves 73 are usually switched to the closed state. Thus, the bypass switching valves 73 are in their closed state in the following description unless specifically stated otherwise.

Note that the same size pipe as the upstream storage unit feeding portion 63a, etc., is used for each bypass portions 72.

(Control Arrangement)

Figure 8:
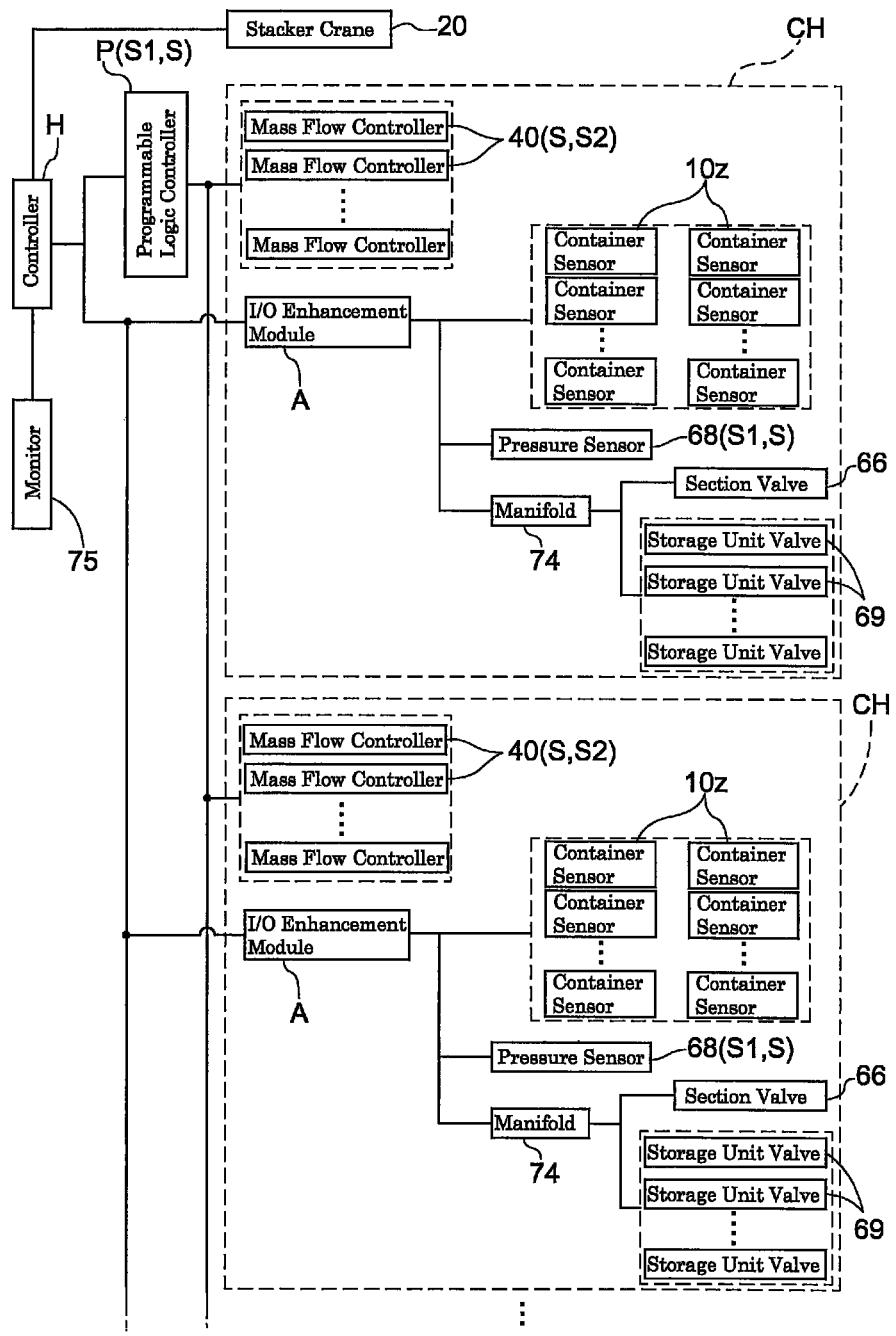
FIG. 8 is a control block diagram.

As shown in FIG. 8, a controller H is configured to manage, among other things, the storage status (which includes locations) of the containers 50 in the storage shelf 10 as well as to control operation of the stacker crane 20 based on a carry-in command and carry-out command from a superordinate controller (not shown).

To describe in more detail, when a carry-in command is issued from the superordinate controller, the controller H performs a carry-in transport process in which the controller H selects, based on the storage status, an empty storage unit 10S, in which no container 50 is stored, as the target storage unit 10S in which a container 50 is to be stored, and in which the controller H controls the operation of the stacker crane 20 to transport the container 50 from the carry in and out conveyor CV to the target storage unit 10S. In addition, when a carry-out command is issued from the superordinate controller, the controller H is configured to perform a carry-out transport process in which the controller H controls, based on the storage status, the operation of the stacker crane 20 to transport the container 50 from the storage unit 10S, in which the container 50 to be carried or taken out is stored, to the carry in and out conveyor CV.

The controller H is configured to transmit, to the programmable logic controller P, feed information which indicates the amount of nitrogen gas to be supplied or fed as well as the storage unit or units 10S to which the nitrogen gas is to be supplied, and to control the operations of the section valves 66, the storage unit valves 69, and the flow rate adjusting valves 70 (mass flow controller 40). The control construction for controlling the operations of the section valves 66, the storage unit valves 69, and the flow rate adjusting valves 70 is described next.

In present embodiment, the pressure adjusting valves 67 and the bypass switching valves 73 are configured to be operated by hand.

The programmable logic controller P and I/O enhancement modules A are connected to the controller H by communication lines for communication. The mass flow controllers 40 for the six sections are connected to the programmable logic controller P. Since 12 mass flow controllers 40 belong to one section CH, the total of 72 mass flow controllers 40 are connected to the programmable logic controller P in the present embodiment.

One I/O enhancement module A is provided to each of the plurality of sections CH, thus, six modules A are provided, which is the same as the number of the sections CH. Connected to each I/O enhancement module A are the container sensors 10z, the pressure sensors 68, and a manifold 74 that belong to the section CH that is associated with the I/O enhancement module A.

Two container sensors 10z are provided to each storage unit 10S as described above; thus, a total of 24 container sensors 10z are provided to each section CH. These 24 container sensors 10z are connected to the I/O enhancement module A.

In addition, the pressure sensor 68 and the manifold 74 are provided to each of the plurality of sections CH so that one pressure sensor 68 and one manifold 74 are associated with each section CH and are connected to the I/O enhancement module A of each section CH. Incidentally, the manifold 74 is configured to be able to open and close the one section valve 66 and 12 storage unit valves 69 that belong to the associated section CH.

And the programmable logic controller P is configured to transmit command information to the manifold 74 through the I/O enhancement module A based on the feed information from the controller H. The manifold 74 is configured to operate, based on the command information, to supply nitrogen gas to the storage unit 10S to which the nitrogen gas is to be supplied. In other words, the controller H performs a flow rate adjusting step in which the controller H controls the operation of the manifold 74 and switching of the storage unit valve 69, through the I/O enhancement module A.

In addition, the programmable logic controller P is configured to transmit command information to the mass flow controller 40 based on the feed information from the controller H. Each mass flow controller 40 is configured to adjust the flow rate of the nitrogen gas discharged from the discharge nozzle 10i by operating the flow rate adjusting valve 70 to achieve the flow rate that is in line, or in accordance, with the command information.

Each mass flow controller 40 is configured to output an abnormal flow condition signal to the programmable logic controller P if and when a state, in which the flow rate detected by the flow rate sensor 71 does not reach the flow rate that is in line with the command information, continues for a set period of time, due, for example, to an abnormal condition that occurred in the flow rate adjusting valve 70. The abnormal flow condition signal is transmitted from the programmable logic controller P to the controller H.

Note that the mass flow controller 40 functions as an abnormal flow condition detecting device for detecting an abnormal condition of the flow rate adjusting valve 70 (mass flow controller 40), as a storage unit supply state detecting device S2 for detecting the supply state of nitrogen gas to each of the plurality of storage units 10S, and as a supply state detecting device S for detecting the supply state of nitrogen gas to the plurality of storage units 10S.

Each I/O enhancement module A is configured to output a reply signal in response to command information from the programmable logic controller P. The programmable logic controller P is configured to transmit an abnormal I/O condition signal to the controller H when there is no reply signal from an I/O enhancement module A in response to command information.

Note that the programmable logic controller P functions as a relay failure detection device for detecting an abnormal condition in the I/O enhancement module A, and as a section supply state detecting device S1 for detecting the supply state of nitrogen gas to each of the plurality of sections CH, and further as a supply state detecting device S for detecting the supply state of nitrogen gas to the plurality of storage units 10S.

Each manifold 74 is configured to output a reply signal in response to command information from the programmable logic controller P. The programmable logic controller P is configured to transmit an abnormal flow rate condition signal to the controller H when there is no reply signal from an manifold 74 in response to command information.

Note that a flow rate adjusting device consists of and is defined by the manifold 74 and the storage unit valves 69, and that each I/O enhancement module A functions as a relaying device for relaying communication between the controller H and the plurality of flow rate adjusting devices belonging to the associated section CH.

The pressure sensor 68 is configured to output detected information to the programmable logic controller P. The programmable logic controller P is configured to transmit an abnormal pressure signal to the controller H if the pressure detected by the pressure sensor 68 deviates from the pressure in line with, or in accordance with, the command information by a value greater than or equal to a set pressure, that is, if a pressure that is abnormal with respect to the pressure that has been adjusted by the pressure adjusting valve 67 is detected by the pressure sensor 68.

Note that the pressure sensor 68 functions as the section supply state detecting device S1 for detecting the supply state of nitrogen gas to each of the plurality of sections CH, and as the supply state detecting device S for detecting the supply state of nitrogen gas to the plurality of storage units 10S.

The controller H performs a storage unit managing step based on the detected information from the supply state detecting device S. A supply state determination, which is a determination as to whether nitrogen gas is properly supplied, is performed in the storage unit managing step. And the plurality of storage units 10S are managed by distinguishing disallowed storage units, which are the storage units 10S for which it is determined that the nitrogen gas is not properly supplied, from allowed storage units 10S which are the storage units that are not disallowed storage units. That is, the controller H manages the plurality of storage units 10S by distinguishing allowed storage units, which are the storage units 10S to which nitrogen gas is properly supplied, from disallowed storage units 10S to which the nitrogen gas is not properly supplied. And the controller H performs a retreating transport operation step if and when a container 50 is stored in a storage unit 10S that is changed from an allowed storage unit to a disallowed storage unit due to changes in the supply state of nitrogen gas. In the retreating transport operation step, a retreating transport operation is performed in which the container 50, that is stored in the storage unit 10S that is changed from an allowed storage unit to a disallowed storage unit due to changes in the supply state of the nitrogen gas, is transported to a storage unit 10S that is managed as an allowed storage unit.

How the controller H manages the plurality of storage units 10S is described further. FIG. 9 shows a section CH in which the nitrogen gas is properly supplied to all of the storage units 10S that belong to the section CH.

FIG. 10 shows a section CH in which the nitrogen gas is not properly supplied to all of the storage units 10S that belong to the section CH. FIG. 11 shows a section CH in which the nitrogen gas is not properly supplied to some of the storage units 10S that belong to the section CH. In FIGS. 10 and 11, the apparatus in which failure occurred (pressure adjusting valve 67 in FIG. 10) and the storage unit 10S managed as a disallowed storage unit are shaded.

If and when a pressure that is abnormal with respect to the pressure that has been adjusted by the pressure adjusting valve 67 is detected by the pressure sensor 68 and an abnormal pressure signal is transmitted from the programmable logic controller P, the controller H is configured to manage and designate all of the storage units 10S, belonging to the section CH associated with the section feeding portion 62 in which the abnormal pressure was detected, as disallowed storage units (see FIG. 10). In other words, the controller H makes a determination as the supply state determination based on the detected information from the pressure sensor 68 as to whether an abnormal pressure, with respect to the pressure that has been adjusted by the pressure adjusting valve 67, is detected by the pressure sensor 68. The controller H determines that abnormal pressure is detected by the pressure sensor 68 if the abnormal pressure signal is transmitted from the programmable logic controller P, and determines the section CH associated with the pressure sensor 68 to be a section CH in which the nitrogen gas is not properly supplied. The controller H determines all of the storage units 10S, belonging to the section CH that is determined to be a section in which the nitrogen gas is not properly supplied (referred to, hereinafter, as the "subject section"), to be storage units 10S to which the nitrogen gas is not properly supplied, and manages them as disallowed storage units.

If and when an abnormal condition of an I/O enhancement module A is detected and an abnormal I/O condition signal is transmitted from the programmable logic controller P, the controller H is configured to manage all of the storage units 10S belonging to the section CH associated with the I/O enhancement module A as disallowed storage units. In other words, the controller H makes a determination as the supply state determination based on the detected information from the programmable logic controller P as to whether the abnormal condition in an I/O enhancement module A is detected by the programmable logic controller P. The controller H determines that an abnormal condition of an I/O enhancement module A is detected if the abnormal I/O condition signal is transmitted from the programmable logic controller P, and determines that the section CH associated with the I/O enhancement module A is a subject section. The controller H determines all of the storage units 10S belonging to the subject section to be storage units 10S to which the nitrogen gas is not properly supplied and manages them as disallowed storage units.

If and when an abnormal condition of the manifold 74 is detected and an abnormal flow rate signal is transmitted from the programmable logic controller P, the controller H is configured to manage all of the storage units 10S belonging to the section CH associated with the manifold 74 as disallowed storage units. In other words, the controller H makes a determination as the supply state determination based on the detected information from the programmable logic controller P as to whether an abnormal condition of the manifold 74 is detected by the programmable logic controller P. The controller H determines that an abnormal condition of the manifold 74 is detected if the abnormal flow rate signal is transmitted from the programmable logic controller P, and determines that the section CH associated with the manifold 74 is a subject section. The controller H determines that all of the storage units 10S belonging to the subject section are storage units 10S to which the nitrogen gas is not properly supplied, and manages them as disallowed storage units.

If and when an abnormal condition of a mass flow controller 40 is detected and an abnormal flow condition signal is transmitted from the programmable logic controller P, the controller H is configured to manage the storage unit 10S, to which the nitrogen gas is supplied through the mass flow controller 40, as a disallowed storage unit (see FIG. 11). In other words, the controller H makes a determination as the supply state determination based on the detected information from the mass flow controller 40 as to whether an abnormal condition of the flow rate adjusting valve 70 is detected by the mass flow controller 40. The controller H determines that an abnormal condition of the flow rate adjusting valve 70 (mass flow controller 40) is detected if an abnormal flow condition signal is transmitted from the programmable logic controller P. The controller H determines the storage unit 10S, to which the nitrogen gas is supplied through the mass flow controller 40, to be a storage unit 10S to which the nitrogen gas is not properly supplied, and manages it as a disallowed storage unit.

As such, the controller H is configured to manage all of the storage units 10S, belonging to the section CH (subject section) for which it is determined that the nitrogen gas is not properly supplied, as disallowed storage units based on the detected information from the section supply state detecting device S1, and is also configured to manage the storage unit 10S, for which it is determined that the nitrogen gas is not properly supplied, as a disallowed storage unit based on the detected information from the storage unit supply state detecting device S2. And the controller H is configured to manage the storage units 10S that are not managed or designated as disallowed storage units as allowed storage units.

The retreating transport operation performed by the controller H is described next.

As shown in FIG. 14, if any changes in the supply state of the inactive gas to any one of the plurality of storage units 10S are detected by the supply state detecting device S (i.e., "Yes" in Step #01), the controller H is configured to change the control status of the storage unit 10S based on the change (Step #02). More specifically, if an abnormal condition signal, which is any one of the abnormal pressure signal, the abnormal flow condition signal, the abnormal flow rate signal and the abnormal I/O condition signal, is transmitted regarding any of the storage units 10S that are managed as allowed storage units, the controller H is configured to change the control status of the storage unit 10S to a disallowed storage unit. And the controller H is configured to change the control status of the storage unit 10S to the allowed storage unit if any of the abnormal condition signals is no longer transmitted regarding the storage unit 10S that is managed as a disallowed storage unit.

And if a container 50 is stored in a storage unit 10S whose control status has been changed from the allowed storage unit to the disallowed storage unit due to changes in the supply state of the nitrogen gas, the controller H performs the retreating transport operation based on the storage status to transport the container 50 to a storage unit 10S that is managed as an allowed storage unit (step #03).

Incidentally, the controller H is configured not to select any of the storage units 10S that are managed as disallowed storage units as the storage unit 10S to which a container 50 is to be brought in when performing a carry-in transport process, so as not to store any containers 50 in any of the storage units 10S that are managed as disallowed storage units.

More specifically, for example, when all of the storage units 10S belonging to a certain section CH are managed as allowed storage units as shown in FIG. 9, and when abnormal pressure is detected by the pressure sensor 68 because the pressure adjusting valve 67 failed and the abnormal pressure signal is transmitted to the controller H, then, as shown in FIG. 10, all of the storage units 10S belonging to the section CH will be managed as disallowed storage units. In such a case, all of the containers 50 stored in the storage units 10S belonging to the section CH in question are transported to the storage units 10S that are managed as allowed storage units in one or more of other sections CH.

Thus, by performing the retreating transport operation to transport the containers 50 to the storage units 10S that are managed as allowed storage units, inactive gas can be properly fed or supplied to the containers 50 because the inactive gas is properly supplied to these storage units 10S. Thus, negative effects on the substrates W in the containers 50 stored by the storage units 10S can be prevented from occurring even when it becomes impossible to properly supply inactive gas to the storage unit 10S.

And in the present embodiment, when transporting all of the containers 50, stored in the storage units 10S belonging to the section CH in question, to one or more of other sections CH by the retreating transport operation, if there are storage units 10S (in the section H in question) for which it is detected by the storage unit supply state detecting device S2 that the nitrogen gas is not properly supplied as well as storage units 10S for which it is detected by the storage unit supply state detecting device S2 that the nitrogen gas is properly supplied, then the containers 50 stored in the former storage units 10S to which the nitrogen gas is not properly supplied are preferentially transported to the storage units 10S managed as allowed storage units. Here, the "former" storage units 10S are the storage units 10S for which it is determined that the nitrogen gas is not properly supplied by the supply state determination based on the detected information from the storage unit supply state detecting device S2 and the "latter" storage units 10S are the rest of the storage units 10S that are not the "former" storage units 10S.

The controller H is configured to control the operation of the monitor 75 to cause the monitor 75 to display information indicating the control status of the plurality of the storage units 10S as well as the apparatus in which an abnormal condition occurred.

As described above, in the present embodiment, a bypass portion 72 is provided to allow communication between two storage unit feeding portions 63 that are paired. And guidance such as the operating procedure for the bypass switching valve 73 etc., is displayed on the monitor 75 after a retreating transport operation is completed.

Thus, an operator can manually operate the bypass switching valve 73 based on the information displayed on the monitor 75, the state of the nitrogen gas feed passages 60, and the state of apparatuses that are installed in the feed passages 60.

As shown in FIGS. 12 and 13, a switched state detection sensor 90 which functions as a switched state detecting device is provided for detecting the changed state of each bypass switching valve 73. And the controller H is configured to manage the storage units 10S belonging to the subject section as disallowed storage units based on the detected information from the switched state detection sensor 90, if the bypass switching valve 73 provided in the bypass portion 72 connected to the storage unit feeding portion 63 of a subject section is closed. Here, as described above, a subject section is a section CH which is determined in a supply state determination based on the detected information from the section supply state detecting device S1 to be a section to which the nitrogen gas is not properly supplied. In other words, the controller H is configured to manage the storage unit 10S belonging to a specific section CH as disallowed storage units based on the detected information from the section supply state detecting device S1 and on the detected information from the switched state detection sensor 90. Here, the specific section CH is a section CH to which the nitrogen gas is not properly supplied and for which the bypass portion 72 connected to the storage unit feeding portion 63 of this section CH is in a state that prohibits passage of the nitrogen gas.

That is, for example, if an abnormal pressure signal is transmitted to the controller H because the pressure adjusting valve 67 associated with the upper section CH shown in FIG. 12 failed, then all of the storage units 10S belonging to that section CH are managed as disallowed storage units. In such a state, when the bypass switching valve 73 provided in the bypass portion 72 connected to the upper section CH is opened, then the nitrogen gas can be supplied as shown in FIG. 13, to the upper section CH from the lower section CH that is connected thereto by the bypass portion 72.

Thus, by opening the bypass switching valve 73, the upper section CH is no longer a specific section CH described above and the control status of the storage units 10S belonging to the upper section CH changes from disallowed storage units to allowed storage units. Therefore, they can be selected as the storage units 10S for storing containers 50 in a container carrying-in operation and thus can store the containers 50. They can also receive the containers 50 stored in other storage units 10S when the control status of those other storage units 10S is changed to disallowed storage units.

Note that the controller H may be configured to control the operation of the section valve 66 to close the section valve 66 belonging to the section CH (subject section) to which nitrogen gas is not properly supplied when the bypass switching valve 73 is opened based on the detected information from the section supply state detecting device S1 and the detected information from the switched state detection sensor 90.

Thus, with the bypass switching valve 73 switched to its closed state or position, the flow rate of the nitrogen gas supplied to the storage unit 10S can be adjusted for each section CH. With the structure described above, if the amount of inactive gas supplied to one or more storage units 10S decreases to below a proper supply amount or if the inactive gas is not supplied to one or more storage units 10S at all due to damage to a nitrogen gas feed passage 60 or failure of, for example, the devices, then the inactive gas can be allowed to flow from the storage unit feeding portion 63 of the section CH to which nitrogen gas is supplied properly to the storage unit feeding portion 63 of the section CH to which nitrogen gas is not supplied properly by opening the bypass switching valve 73.

[Alternative Embodiments]

(1) In the embodiment described above, the section supply state detecting device 51 and the storage unit supply state detecting devices S2 are provided as the supply state detecting device S. However, only one of the section supply state detecting device S1 and the storage unit supply state detecting devices S2 may be provided. In addition, when providing only the storage unit supply state detecting devices S2, it is not necessary to divide the plurality of storage units 10S into a plurality of sections CH.

(2) In the embodiment described above, the pressure detection devices and the relay failure detection devices are provided as the section supply state detecting device S1. However, only one of the pressure detection devices and the relay failure detection device may be provided. And other detecting device, such as a detecting device that detects the flow rate of inactive gas communicated to the storage unit feeding portion 63 may be provided as the section supply state detecting device S1.

(3) In the embodiment described above, the abnormal flow condition detecting device is provided as the storage unit supply state detecting devices S2. However, other detecting device, such as a detecting device that detects the pressure of the inactive gas supplied to the discharge portion may be provided as the storage unit supply state detecting device S2.

(4) In the embodiment described above, an example is described in which the inactive gas feed passages include the main feed portion 61, the section feeding portions 62, and the storage unit feeding portions 63. However, the inactive gas feed passages may include the main feed portion 61 and the storage unit feeding portions 63 connected to the main feed portion 61. In addition, the inactive gas feed passage may include the section feeding portions 62 and the storage unit feeding portions 63. And supply sources for individually supplying inactive gas to each of the section feeding portions 62 may be provided.

(5) In the embodiment described above, one storage shelf 10 is provided in the automated warehouse wherein the storage units 10S provided in the one storage shelf 10 are designated to be the storage units 10S that are managed by designating them either as allowed storage units or disallowed storage units. However, a pair of storage shelves 10 may be provided such that they face each other wherein the storage units 10S provided in the pair of storage shelves 10 may be designated as the storage units 10S that are managed by designating them either as allowed storage units or disallowed storage units. In addition, a plurality of automated warehouses may be provided wherein the storage units 10S provided in the plurality of automated warehouses may be designated as the storage units 10S that are managed by designating them either as allowed storage units or disallowed storage units.

Only some of the plurality of storage units 10S provided in the storage shelf 10 in the automated warehouse may be designated as the storage units 10S that are managed by designating them either as allowed storage units or disallowed storage units.

In addition, a plurality of storage units 10S may be provided to a side of or below the travel path for the ceiling transport vehicle (a hoist type transport vehicle D) and along the travel path. And these storage units 10S provided along the travel path for the ceiling transport vehicle may be designated as the storage units 10S that are managed by designating them either as allowed storage units or disallowed storage units.

(6) In the embodiment described above, an example is described in which the substrates W are semiconductor wafers and the containers 50 to be transported are FOUPs. However, the invention is not limited to this: for example, the substrates W may be reticles and the transported containers 50 may be containers for reticles. In addition, although nitrogen gas is selected as an inactive gas in the embodiment, various kinds of gas, other than nitrogen gas, with low reactivity to the stored substrates W such as gaseous argon, etc., may be used as the inactive gas.

What is claimed is:

1. An article storage facility comprising:
   a plurality of storage units for storing transporting containers for housing substrates;
   a transport device for transporting the transporting containers to the plurality of storage units;
   inactive gas feed passages for supplying inactive gas to each of the plurality of said storage units;
   a discharge portion for discharging the inactive gas supplied to an associated one of the storage units by an associated one of the inactive gas feed passages into the interior of an associated one of the transporting containers stored in the associated one of the storage units;
   a controller for controlling operation of the transport device;
   a supply state detecting device for detecting a supply state of the inactive gas to the plurality of storage units;
   wherein the controller is configured to make a supply state determination which is a determination based on detected information from the supply state detecting device as to whether the inactive gas is properly supplied and to manage the plurality of storage units by distinguishing disallowed storage units for which it is determined that the inactive gas is not properly supplied, from allowed storage units that are the plurality of storage units that are not the disallowed storage units, and wherein the controller is further configured to perform a retreating transport operation in which a transporting container, that is stored in one of the storage units that is changed from the allowed storage unit to the disallowed storage unit due to a change in a supply state of the inactive gas, is transported to another one of the storage units that is managed as the allowed storage unit.

2. The article storage facility as defined in claim 1, wherein the plurality of storage units are divided into a plurality of sections,
   wherein a section supply state detecting device for detecting the supply state of the inactive gas to an associated one of the plurality of sections is provided as the supply state detecting device, and
   wherein the controller is configured to perform the supply state determination based on detected information from the section supply state detecting device and to manage all of the storage units, belonging to a section for which it is determined that the inactive gas is not properly supplied, as the disallowed storage units.

3. The article storage facility as defined in claim 2, wherein the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, wherein a pressure adjusting device for adjusting a pressure of the inactive gas in the storage unit feeding portions is provided in each connection between a respective one of the section feeding portions and the plurality of the storage unit feeding portions, wherein a pressure detection device for detecting a pressure of the inactive gas in each of the plurality of the storage unit feeding portions is provided as the section supply state detecting device, wherein the controller is configured to make a determination as the supply state determination based on detected information from the pressure detection device as to whether an abnormal pressure, with respect to a pressure that has been adjusted by the pressure adjusting device, is detected by the pressure detecting device, and is configured to manage all of the storage units, belonging to the section associated with the section feeding portion in which the abnormal pressure is detected, as the disallowed storage units.

4. The article storage facility as defined in claim 2, wherein the inactive gas feed passages include storage unit feeding portions which divert and supply the inactive gas to each of the plurality of storage units, wherein a flow rate adjusting device for adjusting a flow rate of the inactive gas supplied to respective discharge portion is provided in each connection between an associated one of the storage unit feeding portions and the respective discharge portion, wherein a relaying device for relaying communication between the controller and the plurality of flow rate adjusting devices belonging to respective section is provided, wherein a relay failure detection device for detecting an abnormal condition of the relaying device is provided as the section supply state detecting device, wherein the controller is configured: to control operation of the flow rate adjusting device through the relaying device; to make a determination as the supply state determination as to whether an abnormal condition is detected by the relay failure detection device based on detected information from the relay failure detection device; and to manage all of the storage units, belonging to the section associated with the relaying device in which the abnormal condition is detected, as the disallowed storage units.

5. The article storage facility as defined in claim 1, wherein a storage unit supply state detecting device for detecting a supply state of the inactive gas to each of the plurality of storage units is provided as the supply state detecting device, and wherein the controller is configured to perform the supply state determination based on detected information from the storage unit supply state detecting device and to manage the storage unit, for which it is determined that inactive gas is not properly supplied, as the disallowed storage unit.

6. The article storage facility as defined in claim 5, wherein the plurality of storage units are divided into a plurality of sections, wherein a section supply state detecting device for detecting the supply state of the inactive gas to an associated one of the plurality of sections is provided as the supply state detecting device in addition to the storage unit supply state detecting device, wherein the controller is configured to perform the supply state determination based on detected information from the section supply state detecting device and to manage all of the storage units, belonging to a section for which it is determined that the inactive gas is not properly supplied, as the disallowed storage units, wherein, as the retreating transport operation, the controller is configured to preferentially transport, to the allowed storage unit, the transporting container stored in the storage unit for which it is determined based on detected information from the storage unit supply state detecting device that the inactive gas is not properly supplied.

7. The article storage facility as defined in claim 5, wherein the inactive gas feed passages include storage unit feeding portions which supply the inactive gas to each of the plurality of storage units, wherein a feed rate adjusting device for adjusting a flow rate of the inactive gas supplied to respective discharge portion is provided in each connection between an associated one of the storage unit feeding portions and the respective discharge portion, wherein an abnormal flow condition detecting device for detecting an abnormal condition of the feed rate adjusting device is provided as the storage unit supply state detecting device, wherein the controller is configured to make a determination as the supply state determination based on detected information from the abnormal flow condition detecting device as to whether an abnormal condition is detected by the abnormal flow condition detecting device, and to manage the storage unit, to which the inactive gas is supplied through the feed rate adjusting device in which the abnormal condition was detected, as the disallowed storage unit.

8. An article storage method using an article storage facility including a plurality of storage units for storing transporting containers for housing substrates;

a transport device for transporting the transporting containers to the plurality of storage units;

inactive gas feed passages for supplying inactive gas to each of the plurality of said storage units;

a discharge portion for discharging the inactive gas supplied to an associated one of the storage units by an associated one of the inactive gas feed passages into the interior of an associated one of the transporting containers stored in the associated one of the storage units;

a controller for controlling operation of the transport device;

a supply state detecting device for detecting a supply state of the inactive gas to the plurality of storage units;

the article storage method comprising the following steps that are performed by the controller:

a storage unit managing step in which a supply state determination, which is a determination based on detected information from the supply state detecting device as to whether the inactive gas is properly supplied, is performed, and in which the plurality of storage units are managed by distinguishing disallowed storage units for which it is determined that the inactive gas is not properly supplied, from allowed storage units that are the plurality of storage units that are not the disallowed storage units; and a retreating transport operation step in which a transporting container, that is stored in one of the storage units that is changed from the allowed storage unit to the disallowed storage unit due to a change in a supply state of the inactive gas, is transported to another one of the storage units that is managed as the allowed storage unit.

9. The article storage method as defined in claim 8, wherein the plurality of storage units are divided into a plurality of sections,
wherein a section supply state detecting device for detecting the supply state of the inactive gas to an associated one of the plurality of sections is provided as the supply state detecting device, and
wherein, in the storage unit managing step, the supply state determination is performed based on detected information from the section supply state detecting device, and all of the storage units, belonging to a section for which it is determined that the inactive gas is not properly supplied, are managed as the disallowed storage units.

10. The article storage method as defined in claim 9, wherein
the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section,
wherein the article storage facility includes a pressure adjusting device for adjusting a pressure of the inactive gas in the storage unit feeding portions, the pressure adjusting device being provided in each connection between a respective one of the section feeding portions and the plurality of the storage unit feeding portions,
wherein a pressure detection device for detecting a pressure of the inactive gas in each of the plurality of the storage unit feeding portions is provided as the section supply state detecting device,
wherein, in the storage unit managing step, a determination is made as the supply state determination based on detected information from the pressure detection device as to whether an abnormal pressure, with respect to a pressure that has been adjusted by the pressure adjusting device, is detected by the pressure detecting device, and all of the storage units, belonging to the section associated with the section feeding portion in which the abnormal pressure is detected, are managed as the disallowed storage units.

11. The article storage method as defined in claim 9, wherein
the inactive gas feed passages include storage unit feeding portions which divert and supply the inactive gas to each of the plurality of storage units,
wherein the article storage facility includes a flow rate adjusting device for adjusting a flow rate of the inactive gas supplied to respective discharge portion with the flow rate adjusting device being provided in each connection between an associated one of the storage unit feeding portions and the respective discharge portion, and
a relaying device for relaying communication between the controller and the plurality of flow rate adjusting devices belonging to respective section,
wherein a relay failure detection device for detecting an abnormal condition of the relaying device is provided as the section supply state detecting device,
wherein the steps performed by the controller further comprises a flow rate adjusting step in which an operation of the flow rate adjusting device is controlled through the relaying device, and
wherein, in the storage unit managing step, a determination is made as the supply state determination as to whether an abnormal condition is detected by the relay failure detection device based on detected information from the relay failure detection device, and all of the storage units, belonging to the section associated with the relaying device in which the abnormal condition is detected, are managed as the disallowed storage units.

12. The article storage method as defined in claim 8, wherein
a storage unit supply state detecting device for detecting a supply state of the inactive gas to each of the plurality of storage units is provided as the supply state detecting device, and
wherein, in the storage unit managing step, the supply state determination is performed based on detected information from the storage unit supply state detecting device, and the storage unit, for which it is determined that inactive gas is not properly supplied, is managed as the disallowed storage unit.

13. The article storage method as defined in claim 12, wherein
the plurality of storage units are divided into a plurality of sections,
wherein a section supply state detecting device for detecting the supply state of the inactive gas to an associated one of the plurality of sections is provided as the supply state detecting device in addition to the storage unit supply state detecting device,
wherein, in the storage unit managing step, the supply state determination is performed based on detected information from the section supply state detecting device, and all of the storage units, belonging to a section for which it is determined that the inactive gas is not properly supplied, are managed as the disallowed storage units, and
wherein, in the retreating transport operation step, the transporting container, that is stored in the storage unit for which it is determined based on detected information from the storage unit supply state detecting device that the inactive gas is not properly supplied, is preferentially transported to the allowed storage unit.

14. The article storage method as defined in claim 12, wherein
the inactive gas feed passages include storage unit feeding portions which supply the inactive gas to each of the plurality of storage units,
wherein the article storage facility includes a feed rate adjusting device for adjusting a flow rate of the inactive gas supplied to respective discharge portion, the feed rate adjusting device being provided in each connection between an associated one of the storage unit feeding portions and the respective discharge portion,
wherein an abnormal flow condition detecting device for detecting an abnormal condition of the feed rate adjusting device is provided as the storage unit supply state detecting device,
wherein, in the storage unit managing step, a determination is made as the supply state determination based on detected information from the abnormal flow condition detecting device as to whether an abnormal condition is detected by the abnormal flow condition detecting device, and the storage unit, to which the inactive gas is supplied through the feed rate adjusting device in which the abnormal condition was detected, is managed as the disallowed storage unit.

* * * * *